(12) United States Patent
Yim

(10) Patent No.: US 10,242,976 B2
(45) Date of Patent: Mar. 26, 2019

(54) IN-PACKAGE PHOTONICS INTEGRATION AND ASSEMBLY ARCHITECTURE

(71) Applicant: Intel Corporation, Santa Clara, CA (US)

(72) Inventor: Myung Jin Yim, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/396,467

(22) Filed: Dec. 31, 2016

(65) Prior Publication Data

US 2018/0188448 A1    Jul. 5, 2018

(51) Int. Cl.
| | | |
|---|---|---|
| H01L 25/00 | (2006.01) | |
| H01L 25/065 | (2006.01) | |
| G02B 6/42 | (2006.01) | |

(52) U.S. Cl.
CPC .......... H01L 25/50 (2013.01); H01L 25/0652 (2013.01); *G02B 6/4274* (2013.01); *H01L 2225/06513* (2013.01); *H01L 2225/06517* (2013.01); *H01L 2225/06589* (2013.01)

(58) Field of Classification Search
CPC ..... G02B 6/122; H01L 25/0652; H01L 25/50; H01L 2225/06513; H01L 2225/06517; H01L 2225/06589
See application file for complete search history.

(56) References Cited

U.S. PATENT DOCUMENTS

| | | | |
|---|---|---|---|
| 6,333,553 B1 * | 12/2001 | Pogge ..................... | H01L 24/95 257/723 |
| 6,391,214 B1 * | 5/2002 | Kovacic ................... | G02B 6/42 216/24 |
| 6,509,640 B1 * | 1/2003 | Li ................................. | 257/678 |
| 7,223,635 B1 * | 5/2007 | Brewer .................... | B81C 3/002 257/E21.505 |
| 7,235,880 B2 * | 6/2007 | Prokofiev ......... | H01L 23/49838 257/678 |
| 8,971,676 B1 * | 3/2015 | Thacker ................... | G02B 6/12 385/14 |

(Continued)

FOREIGN PATENT DOCUMENTS

| | | |
|---|---|---|
| WO | 2006088859 A2 | 8/2006 |
| WO | 2018125468 | 7/2018 |

OTHER PUBLICATIONS

Yim et al., Anisotropic conductive adhesives with enhanced thermal conductivity for flip chip applications, 2004 Proceedings. 54th Electronic Components and Technology Conference (IEEE Cat. No. 04CH37546), 2004, pp. 159-164 vol. 1.*

(Continued)

*Primary Examiner* — Peter Radkowski

(74) *Attorney, Agent, or Firm* — Jaffery, Watson, Mendonsa & Hamilton LLP

(57) ABSTRACT

In one embodiment, a microelectronic package structure comprises a substrate comprising at least one waveguide, a first instrument integrated circuit coupled to the substrate, a photonic engine coupled to the substrate and comprising an integrated circuit body, a transmit die, and a receive die. The photonic engine is positioned adjacent the at least one waveguide such that optical signals may be exchanged between the at least one waveguide and the transmit die and the at least one waveguide and the receive die. Other embodiments may be described.

9 Claims, 7 Drawing Sheets

(56) References Cited

U.S. PATENT DOCUMENTS

| | | | |
|---|---|---|---|
| 9,020,001 B2* | 4/2015 | Doerr | H01S 5/125 |
| | | | 372/44.01 |
| 9,250,403 B2* | 2/2016 | Thacker | G02B 6/4274 |
| 9,256,026 B2* | 2/2016 | Thacker | G02B 6/12 |
| 9,297,971 B2* | 3/2016 | Thacker | G02B 6/4274 |
| 2003/0183909 A1* | 10/2003 | Chiu | H01L 23/04 |
| | | | 257/667 |
| 2005/0111781 A1 | 5/2005 | Jain et al. | |
| 2009/0154872 A1 | 6/2009 | Sherrer et al. | |
| 2013/0114924 A1 | 5/2013 | Loh et al. | |
| 2013/0249109 A1* | 9/2013 | Ma | H01L 23/481 |
| | | | 257/774 |
| 2014/0064659 A1* | 3/2014 | Doerr | G02B 6/428 |
| | | | 385/14 |
| 2014/0203175 A1 | 7/2014 | Kobrinsky et al. | |
| 2014/0321803 A1* | 10/2014 | Thacker | G02B 6/4274 |
| | | | 385/14 |
| 2014/0321804 A1* | 10/2014 | Thacker | G02B 6/4274 |
| | | | 385/14 |
| 2014/0369693 A1* | 12/2014 | Peterson | H01L 21/84 |
| | | | 398/138 |
| 2015/0098677 A1* | 4/2015 | Thacker | G02B 6/12 |
| | | | 385/14 |
| 2016/0216445 A1* | 7/2016 | Thacker | G02B 6/12004 |

OTHER PUBLICATIONS

Yim et al., Ultra thin PoP top package using compression mold: Its warpage control, 2011 IEEE 61st Electronic Components and Technology Conference (ECTC), Lake Buena Vista, FL, 2011, pp. 1141-1146.*

International Search Report and Written Opinion received for International Application No. PCT/US2017/063469, dated Mar. 14, 2018, 12 pages.

* cited by examiner

IN-PACKAGE PHOTONICS INTEGRATION AND ASSEMBLY ARCHITECTURE

RELATED APPLICATIONS

None.

BACKGROUND

The subject matter described herein relates generally to the field of electronic devices and more particularly to an in-package photonics integration and assembly architecture.

Technical advances such as increases in connectivity technologies and the growth of processing loads are generating ever-increasing demands on bandwidth and transmission speeds. Data centers are considering optical interconnects which rely on photons instead of electrons to send data between servers, racks, and boards, and how best to make high speed photonic connections between chips as well.

Wide adoption of photonics links depends on connecting optics to electronics by optics module miniaturization technologies which provide low power consumption and high bandwidth throughput and which can be manufactures using high volume and low cost manufacturing techniques. There has been lots of progress including integration of photonics on silicon, and integration of chips on interposers for standard IC packaging. Highly integrated optical module at small form factor is critical in enabling high bandwidth and low power optical interconnect between chips. Accordingly additional architectures for in-package photonics integration for electronic components may find utility.

BRIEF DESCRIPTION OF THE DRAWINGS

The detailed description is described with reference to the accompanying figures.

DETAILED DESCRIPTION

Figure 1:
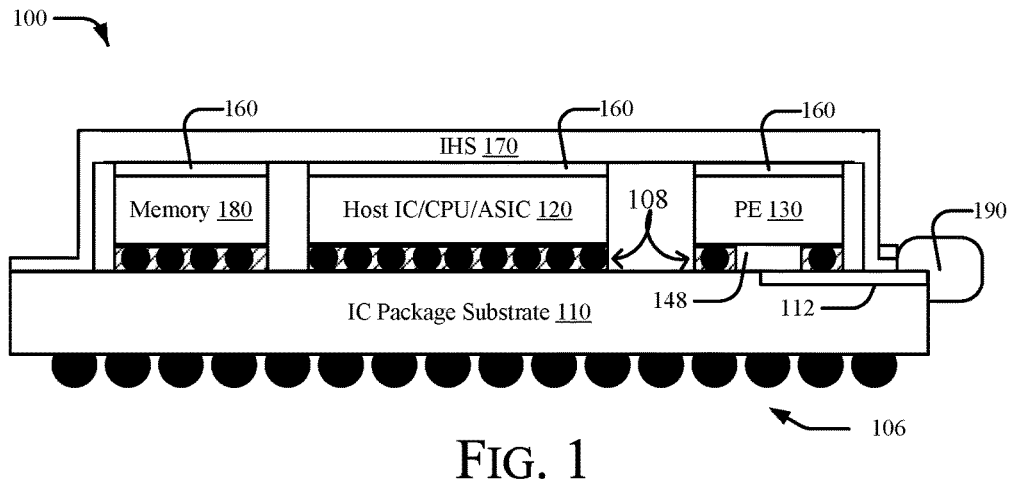
FIG. 1 is a side view, schematic illustration of an in-package optics-based co-package architecture, in accordance with some embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

In accordance with aspects described herein, a photonic integrated circuit (IC) may be integrated on electronic integrated circuit (IC) using a wafer level package structure to provide an effective thermal, electrical and optical coupling structure which may assembled using high throughput manufacturing techniques. By using wafer level packaging infrastructure, the optical module itself becomes fully integrated photonic engine enabling that the optical path and electrical paths downward, and thermal path upward, and then co-packaging assembly process is fully compatible with conventional multi-die flip chip BGA assembly process with heat spreader, and further optics assembly afterward either by passive alignment or active alignment.

The invention also details the process flow that can enable the integration of photonic IC on UIC integration by wafer level package to make the photonic engine die and optical/electrical interconnect by using it for in-package photonics assembly to be compatible the electrical and optical assembly requirement and high volume manufacturability.

Described herein are techniques and architectures to integrate a photonic integrated circuit (IC) on electronic IC using a wafer-level package structure. The architecture may provide an effective thermal, electrical and optical coupling structure which may be assembled using high throughput manufacturing techniques. Further, the architecture described herein provides packaging-level optic system integration for photonics in package assembly solution.

By using a wafer-level packaging infrastructure, an optical module may be implemented as a fully integrated photonic engine on the electronic integrated circuit (IC). In some examples described herein the optical path and electrical paths are disposed in a first orientation (i.e., downward), and the thermal path is disposed in a second orientation (i.e., upward). The co-packaging assembly process is fully compatible with conventional multi-die flip chip BGA assembly processes, with heat spreaders, and further optics assembly afterward either by passive alignment or active alignment. Also described herein are techniques to enable the integration of photonic integrated circuit (IC) on a universal integrated circuit (IC) by wafer-level package to make the photonic engine die and optical/electrical interconnect compatible.

Figure 2:
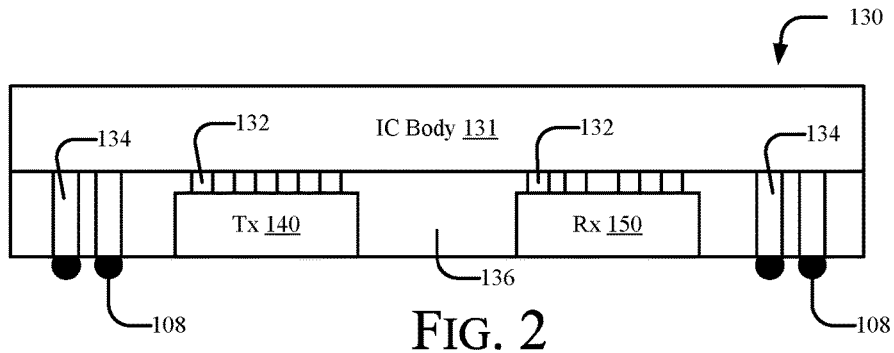
FIG. 2 is a side view, schematic illustration of a photonic engine integration on an electronic integrated circuit (IC) wafer, in accordance with some embodiments.

FIG. 1 is a side view, schematic illustration of an in-package optics-based co-package architecture, and FIG. 2 is a side view, schematic illustration of a photonic engine integration on an electronic integrated circuit (IC) wafer, in accordance with some embodiments. Referring to FIG. 1 and FIG. 2, in some examples a microelectronic package structure 100, comprises a substrate 110 comprising at least one waveguide 112, a first instrument integrated circuit 120 coupled to the substrate 100, a photonic engine 130 coupled to the substrate and comprising an integrated circuit body 131, a transmit die 140, and a receive die 150.

In some examples the microelectronic package structure 100 of claim may comprise a memory device 180 coupled to the substrate 110. A thermal interface material (TIM) 160 layer may be formed in thermal communication with the photonic engine 130, the first integrated circuit 120, the photonic engine 130 and the memory device 180. An integrate heat spreader (IHS) is 170 in thermal communication with the thermal interface material 160.

In some examples the microelectronic package structure 100 may further comprise a ball grid array 106 positioned proximate a surface of the substrate 110 to provide electrical connections with an underlying device, e.g., a printed circuit board.

Referring to FIG. 2, in some examples the a photonic engine 130 comprises an integrated circuit body 131, a transmit die 140, and a receive die 150. In some examples the transmit die 140 and the receive die 150 are coupled to the photonic engine 130 by a first plurality of bumps 132 having a first height and one or more solder balls 108 are coupled to the photonic engine 130 by a second plurality of bumps 134 having a second height, greater than the first height. One or more solder balls 108 are coupled to the second plurality of bumps 134. The photonic engine 130 is coupled to the substrate 110 via the one or more solder balls 108, which are at least partially covered by a mold material 136.

Referring back to FIG. 1, the photonic engine 130 is positioned adjacent the at least one waveguide 112 such that optical signals may be exchanged between the at least one waveguide 112 and the transmit die 140 and the at least one waveguide 112 and the receive die 150. In some examples the mold material 136 defines an air gap 148 between the transmit die 140 and the at least one waveguide 112 and the receive die 150 and the at least one waveguide 112 through which optical signals may be transmitted. The microelectronic package structure 100 further comprises an optical coupling 190 coupled to the at least one waveguide 112.

In some examples the photonic engine 130 is coupled to the substrate 110 via one or more solder balls 108, which the are at least partially covered by a mold material 136 such that the mold material 136 defines an air gap 148 between the transmit die 140 and the at least one waveguide 112 and the receive die 150 and the at least one waveguide 112. In the example depicted in FIG. 1 the photonic engine 130 is positioned adjacent the at least one waveguide 112 such that optical signals may be exchanged between the at least one waveguide 112 and the transmit die 140 and the at least one waveguide 112 and the receive die 150.

In some examples the first integrated circuit 120 may comprise any type of device suitable for a particular application, such as but not limited to a microprocessor, a graphics processor, a signal processor, a network processor, a chipset, etc. In one embodiment, the integrated circuit 120 may comprise a system-on-chip (SoC) having one or more functional units (e.g., one or more processing units, one or more graphics units, one or more communications units, one or more signal processing units, one or more security units, etc.). However, it should be understood that the disclosed embodiments are not limited to any particular type or class of die/devices. An active side (which may comprise various circuit components such as transistors, for example) of the integrated circuit 120 may be electrically and physically coupled with the substrate 110 by solder balls/conductive structures 108.

The conductive structures 108 may comprise any type of structure and materials capable of providing electrical communication between the integrated circuit 120 and substrate 110. In the embodiment, each of the interconnects 108 comprises an electrically conductive terminal on the die (e.g., a pad, bump, stud bump, column, pillar, or other suitable structure or combination of structures) and a corresponding electrically conductive terminal on the substrate 110 (e.g., a pad, bump, stud bump, column, pillar, or other suitable structure or combination of structures). Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between the integrated circuit 120 and substrate 110).

The terminals on integrated circuit 120 may comprise any suitable material or any suitable combination of materials, whether disposed in multiple layers or combined to form one or more alloys and/or one or more intermetallic compounds. For example, the terminals on integrated circuit 120 may include copper, aluminum, gold, silver, nickel, titanium, tungsten, as well as any combination of these and/or other metals. In other embodiments, a terminal may comprise one or more non-metallic materials (e.g., a conductive polymer). Similarly, terminals on substrate 110 may also comprise any suitable material or any suitable combination of materials, whether disposed in multiple layers or combined to form one or more alloys and/or one or more intermetallic compounds. For example, the terminals on substrate 110 may include copper, aluminum, gold, silver, nickel, titanium, tungsten, as well as any combination of these and/or other metals. Any suitable solder material may be used to join the mating terminals of the integrated circuit 120 and substrate 110, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

Figure 3:
FIG. 3 is a flowchart illustrating operations in a method to make an in-package photonic integration architecture, according to embodiments.
Figure 4A:
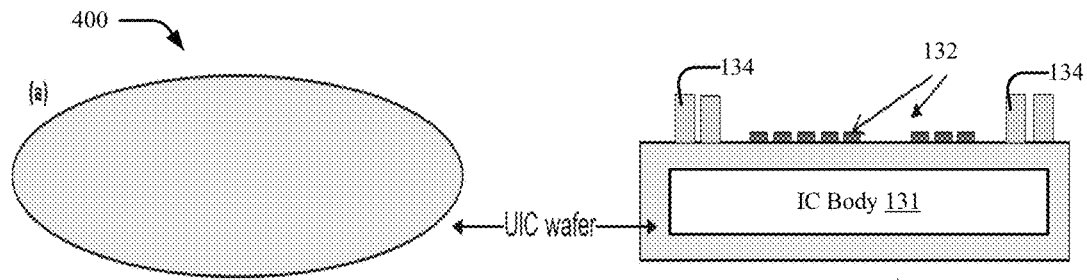
FIGS. 4A-4E illustrate an in-package photonic integration architecture in various stages of formation, according to embodiments.

FIG. 3 is a flowchart illustrating operations in a method to make an in-package photonic integration architecture, and FIGS. 4A-4E illustrate an in-package photonic integration architecture in various stages of formation on a wafer 400, according to embodiments. Referring to FIG. 3A and FIGS. 4A-4E, at operation 310 the dual height bumps 132, 134 are formed on a surface of the IC body 131 (FIG. 4A). In some examples the first plurality of bumps 132 and the second plurality of bumps 134 may be fabricated in a region of a die to which the Tx die 140 and the Rx die 150 are to be attached.

Figure 4B:
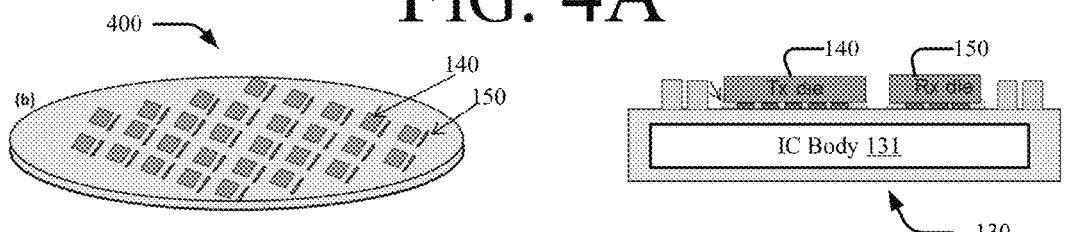

At operation 315 the photonic Tx die 140 and the Rx die 150 are attached to the IC body 131 and may be underfilled with a molding material as shown in FIG. 4B. The Tx die 140 and Rx die 150 have front-side micro-bumping and backside optical coupling path by backside lens array formation.

Figure 4C:
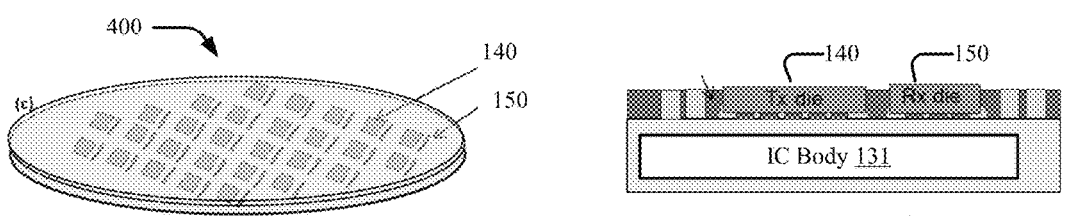
Figure 4D:
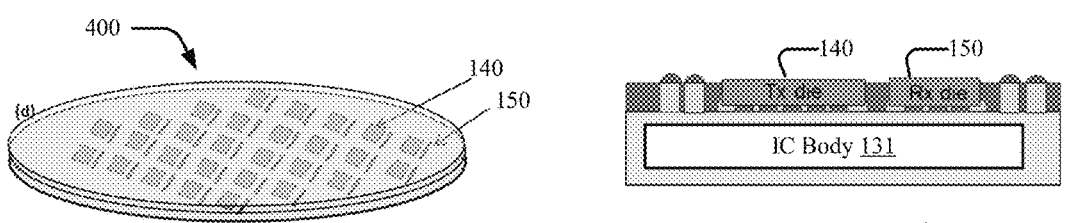
Figure 4E:
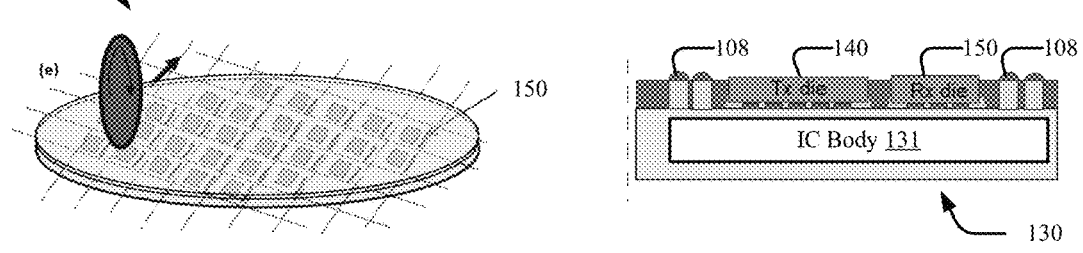

At operation 320 the wafer is leveled by applying a molding material 136 as illustrated in FIG. 4C. The Tx die 140 and Rx die 140 are exposed. Similarly the second plurality of bumps 134 are exposed. At operation 325 the solder balls 108 are attached to the exposed second plurality of bumps 134, as illustrated in FIG. 4D. Finally, at operation 330 the wafer may be diced to separate the discrete photonic engine 130 integrated circuits, as illustrated in FIG. 4E.

Figure 5:
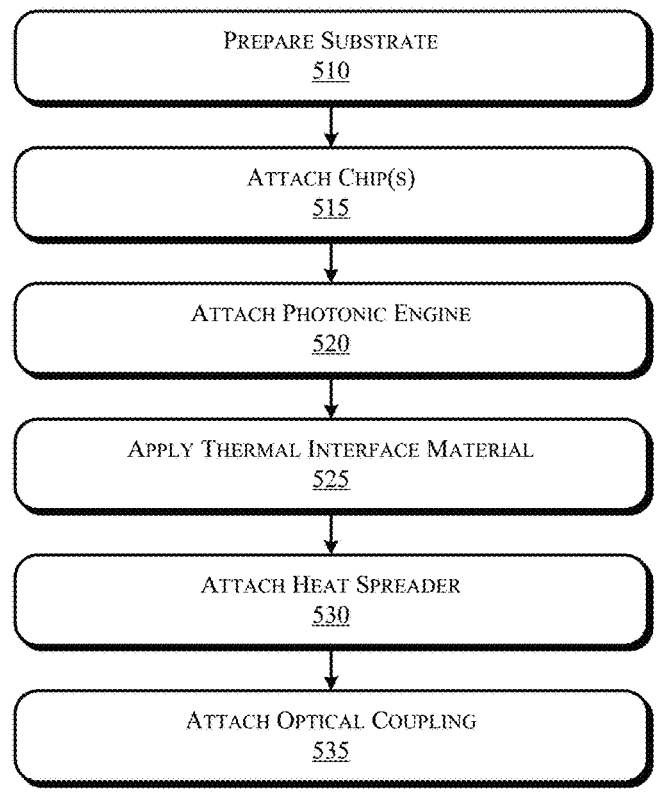
FIG. 5 is a flowchart illustrating operations in a method to assemble an in-package photonic integration architecture, according to embodiments.
Figure 6A:
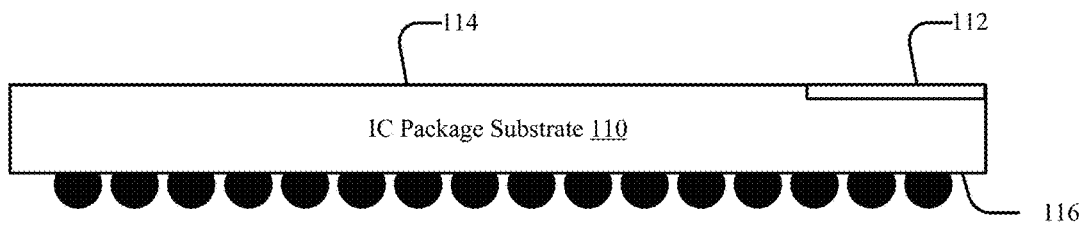
FIGS. 6A-6F illustrate an in-package photonic integration architecture in various stages of formation, according to embodiments.
Figure 6B:
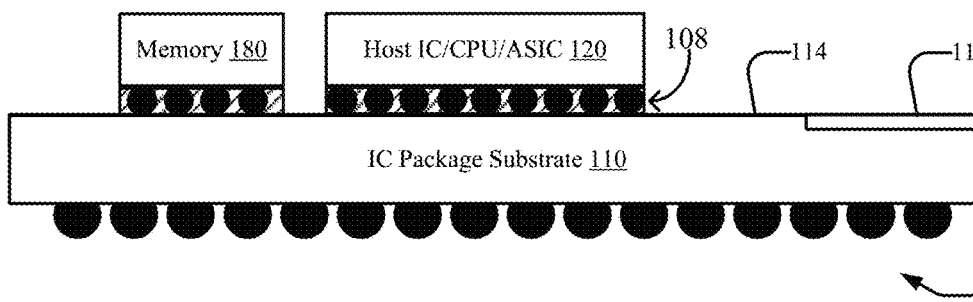
Figure 6C:
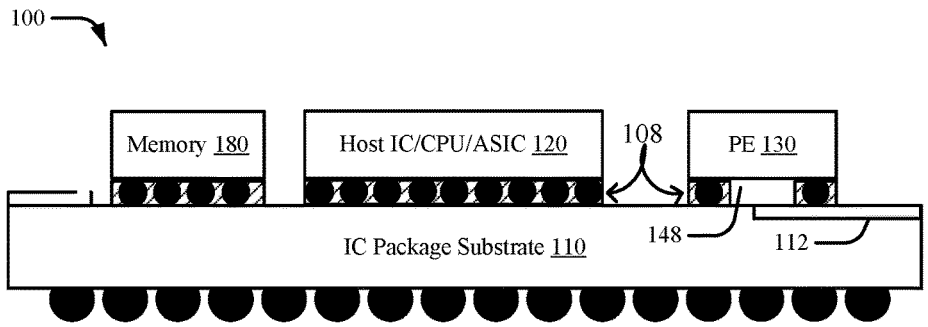

FIG. 5 is a flowchart illustrating operations in a method to assemble an in-package photonic integration architecture, and FIGS. 6A-6F illustrate an in-package photonic integration architecture in various stages of formation, according to embodiments. Referring to FIG. 5 and FIGS. 6A-6F, at operation 510 the substrate 110 is prepared (FIG. 6A). In some examples the substrate 110 may be prepared with electrical and/or optical routing on a first surface 114 thereof. For example, a patterning material such as a resist material may be formed on the first surface 112 of the substrate 112. The resist material may be patterned to form channels that circuit trace paths and paths for one or more waveguides. A conductive material may be formed within the channels to define circuit traces. The conductive material may comprise any suitable conductive material, such as copper, for example, and may be formed using any suitable process, such as a plating process, for example. Similarly, an optically transmissive material, e.g., an optical fiber, may be formed within the channel to define the waveguide 112. Further, the ball grid array 106 may be formed on a second surface 116 of the substrate 110.

At operation 515 one or more integrated circuits may be attached to the substrate 110. For example, referring to FIG. 6B, the integrated circuit 120 and the memory device 180 may be attached to the substrate 110 using solder balls 108.

At operation 520 the photonic engine 130 is attached to the substrate 110 using solder balls 108. As described above and illustrated in FIG. 6C, the photonic engine 130 may be attached by solder balls 106 which the are at least partially covered by a mold material 136 such that the mold material 136 defines an air gap 148 between the transmit die 140 and the at least one waveguide 112 and the receive die 150 and the at least one waveguide 112.

Figure 6D:
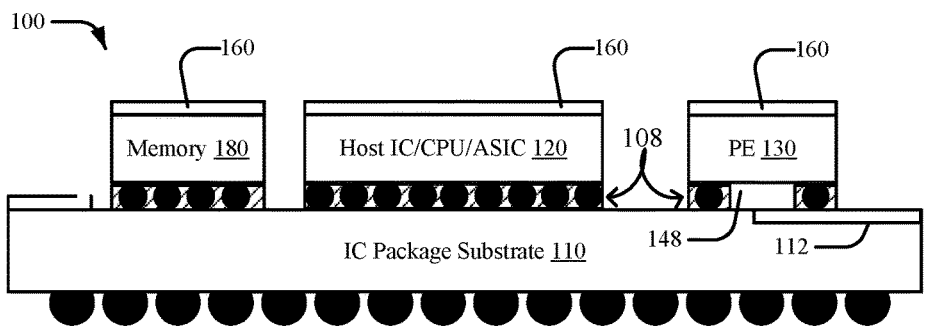
Figure 6E:
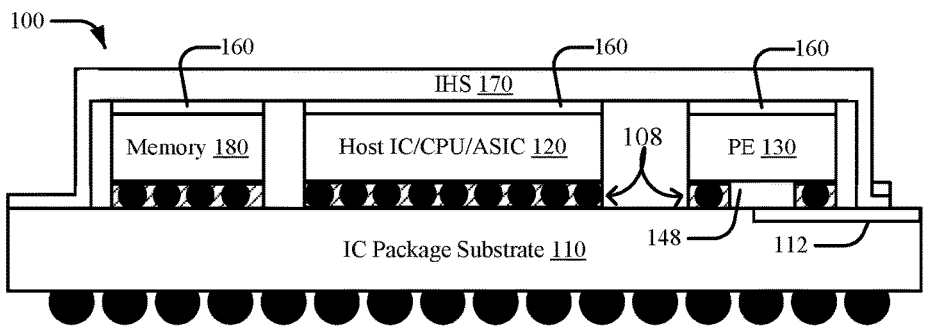

At operation 525 the thermal interface material (TIM) 160 is applied to the memory device 180, the integrated circuit 120, and the photonic engine 160, as illustrated in FIG. 6D. Suitable thermal interface materials may include a silicon-based oil doped with aluminum oxide, zinc oxide, or the like.

Figure 6F:
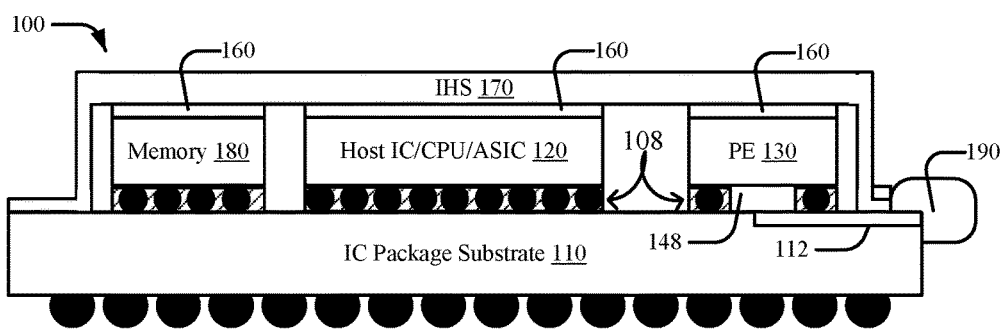

At operation 530 the integrated heat spreader (IHS) 170 is attached to the thermal interface material 160 (FIG. 6E), and at operation 535 the optical coupling 190 is attached (FIG. 6F).

Figure 7:
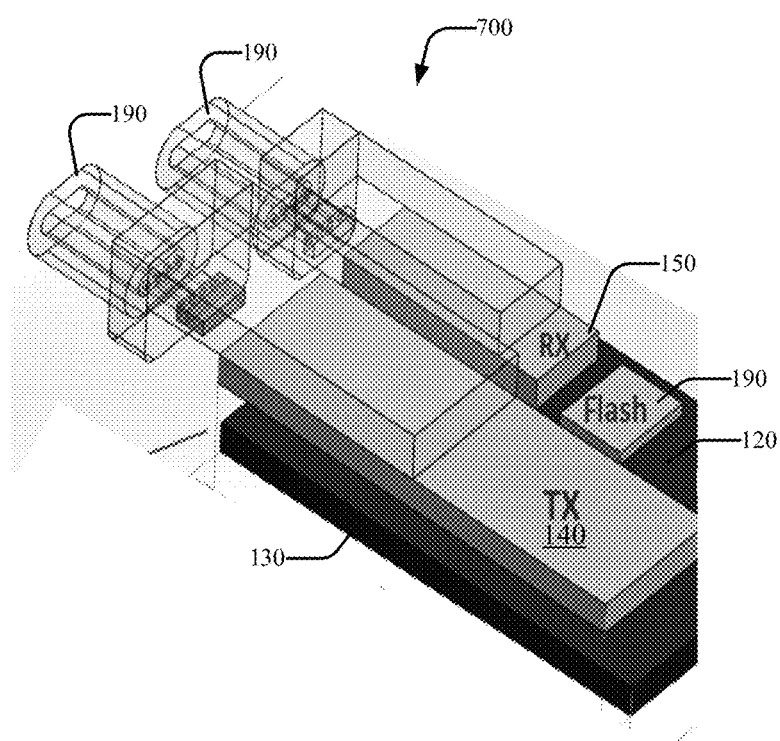
FIG. 7 is a schematic illustration of a universal integrated circuit (IC) based photonic engine block, according to embodiments.

FIG. 7 is a schematic illustration of a universal integrated circuit (IC) based photonic engine block 700, according to embodiments. Referring to FIG. 7, in some examples the Tx die 140 and the Rx die 150 are mounted on photonic engine 130 and are coupled to respective first and second optical couplings 190.

Figure 8A:
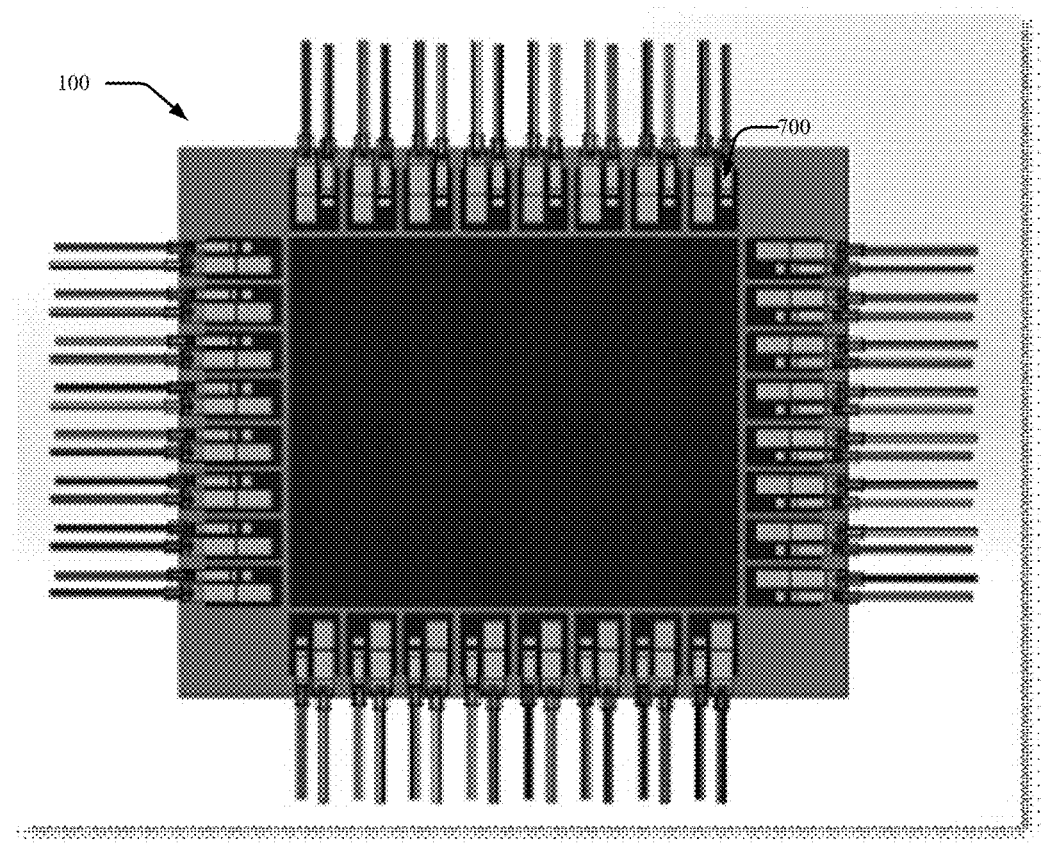
FIG. 8A is a top view, schematic illustration of a co-package optics interconnect, in accordance with some embodiments.
Figure 8B:
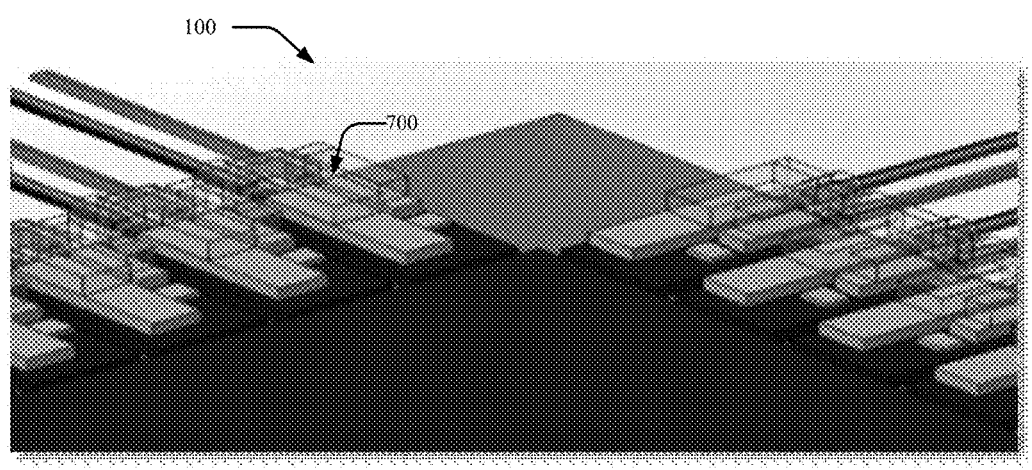
FIG. 8B is a top view, schematic illustration of a co-package optics interconnect, in accordance with some embodiments.

FIG. 8A is a top view, schematic illustration of a co-package optics interconnect, and FIG. 8B is a top view, schematic illustration of a co-package optics interconnect, in accordance with some embodiments. As illustrated in FIGS. 8A and 8B, microelectronic package structure 100 may be provided with a plurality of photonic engine blocks 700 to provide a corresponding plurality of optical interconnects with the integrated circuit 120.

Thus, as described herein one or more photonic engine blocks 700 may be attached to an integrated circuit package 100 to provide an electrical path in a first direction (i.e., down) via solder bump array bonding and underfilling and an optical path via a lens to substrate waveguide connecting to substrate edge coupling 190, which in turn may connect to a single mode fiber (SMF) array. The architecture further provides a thermal dissipation path in a second direction (i.e., upward) via the thermal interface material (TIM) 160 and the integrated heat spreader (IHS) 170. All components such as integrated circuit 120, memory device 180 and photonic engine 130 may be assembled to substrate 110 where electrical routing and optical waveguide may be fabricated in the same plane. The heat spreader attach process and optical coupling assembly can be done as last step to avoid a high temperature process on the optical coupling structure 190 and an SMF array.

Figure 9:
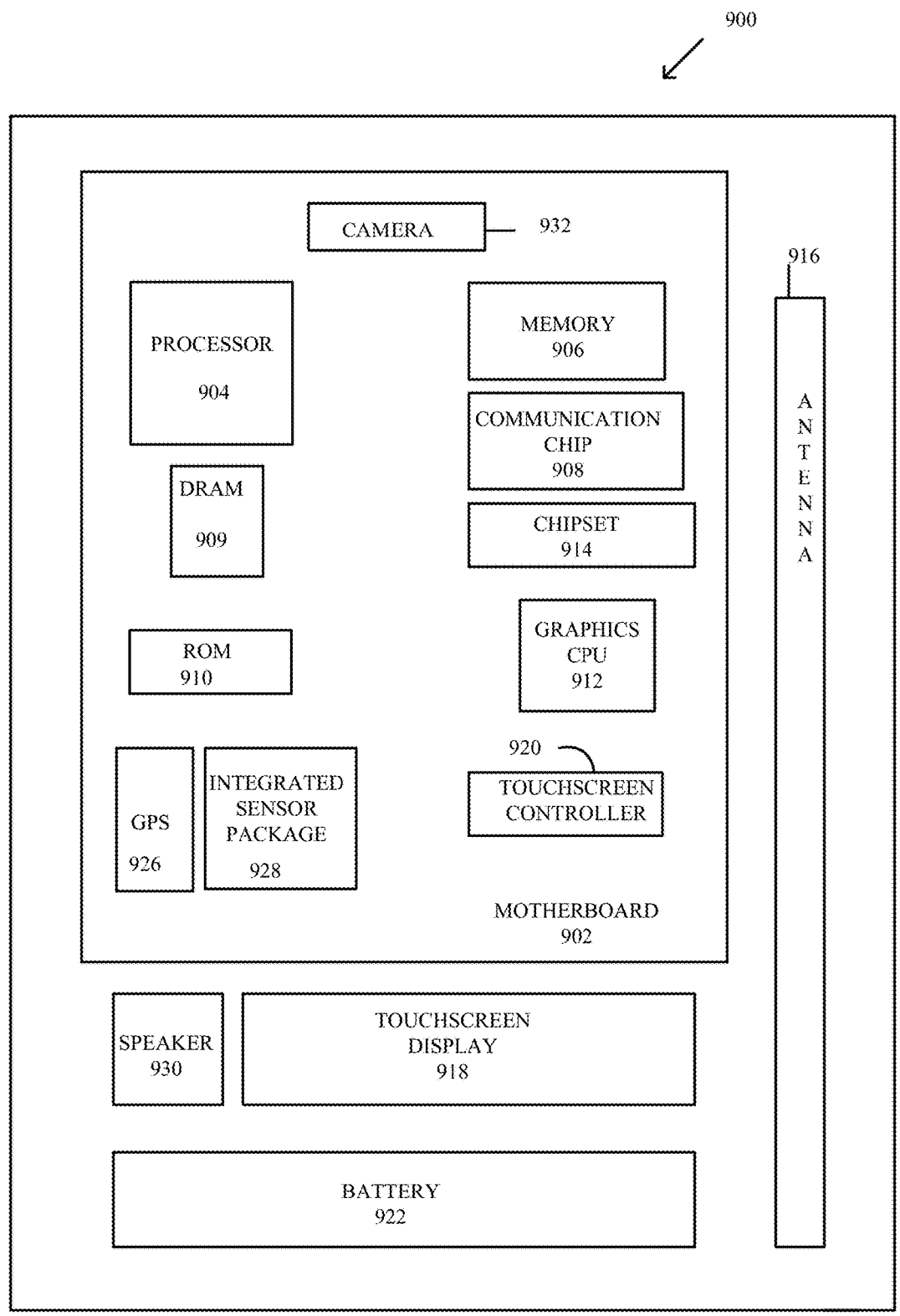
FIG. 9 represents a schematic of a computing device according to embodiments.

FIG. 9 is a schematic of a computing device 900 that may be implemented incorporating embodiments of the package structures described herein. For example, any suitable ones of the components of the computing device 900 may include, or be included in, a stacked die/PoP assembly in accordance with any of the embodiments disclosed herein. In an embodiment, the computing device 900 houses a board 902, such as a motherboard 902 for example. The board 902 may include a number of components, including but not limited to a processor 904, an on-die memory 906, and at least one communication chip 908. The processor 904 may be physically and electrically coupled to the board 902. In some implementations the at least one communication chip 908 may be physically and electrically coupled to the board 902. In further implementations, the communication chip 908 is part of the processor 904.

Depending on its applications, computing device 900 may include other components that may or may not be physically and electrically coupled to the board 902, and may or may not be communicatively coupled to each other. These other components include, but are not limited to, volatile memory (e.g., DRAM) 909, non-volatile memory (e.g., ROM) 910, flash memory (not shown), a graphics processor unit (GPU) 912, a chipset 914, an antenna 916, a display 918 such as a touchscreen display, a touchscreen controller 920, a battery 922, an audio codec (not shown), a video codec (not shown), a global positioning system (GPS) device 926, a speaker 930, a camera 932, compact disk (CD) (not shown), digital versatile disk (DVD) (not shown), and so forth). These components may be connected to the system board 902, mounted to the system board, or combined with any of the other components.

The communication chip 908 enables wireless and/or wired communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 900 may include a plurality of communication chips 908. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 900 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

The following pertains to various examples.

Example 1 is a microelectronic package structure, comprising a substrate comprising at least one waveguide; a first instrument integrated circuit coupled to the substrate; a photonic engine coupled to the substrate and comprising an integrated circuit body, a transmit die; and a receive die; wherein the photonic engine is positioned adjacent the at least one waveguide such that optical signals may be exchanged between the at least one waveguide and the transmit die and the at least one waveguide and the receive die.

Example 2 may optionally include the subject matter of example 1, wherein the photonic engine is coupled to the substrate via one or more solder balls; and the one or more solder balls are at least partially covered by a mold material, wherein the mold material defines an air gap between the transmit die and the at least one waveguide and the receive die and the at least one waveguide.

Example 3 may optionally include the subject matter of any one of examples 1-2, wherein the transmit die and the receive die are coupled to the photonic engine by a first plurality of bumps having a first height; and the one or more solder balls are coupled to the photonic engine by a second plurality of bumps having a second height, greater than the first height.

Example 4 may optionally include the subject matter of any one of examples 1-3, further comprising an optical coupling coupled to the at least one waveguide.

Example 5 may optionally include the subject matter of any one of examples 1-4, further comprising a thermal interface material (TIM) in thermal communication with the photonic engine.

Example 6 may optionally include the subject matter of any one of examples 1-5, further comprising a heat spreader in thermal communication with the thermal interface material.

Example 7 may optionally include the subject matter of any one of examples 1-6, further comprising a ball grid array positioned proximate a surface of the substrate.

Example 8 may optionally include the subject matter of any one of examples 1-7, further comprising a memory device coupled to the substrate.

Example 9 may optionally include the subject matter of any one of examples 1-8, further comprising a thermal interface material (TIM) in thermal communication with the memory device.

Example 10 may optionally include the subject matter of any one of examples 1-9, further comprising a heat spreader in thermal communication with the thermal interface material.

Example 11 is a photonic engine, comprising an integrated circuit body; a transmit die; and a receive die; wherein the transmit die and the receive die are coupled to the photonic engine by a first plurality of bumps having a first height; and the one or more solder balls are coupled to the photonic engine by a second plurality of bumps having a second height, greater than the first height.

Example 12 may optionally include the subject matter of any one of example 11, wherein the photonic engine is coupled to a substrate via the one or more solder balls; and the one or more solder balls are at least partially covered by a mold material, wherein the mold material defines an air gap between the transmit die and at least one waveguide on the substrate and the receive die and the at least one waveguide on the substrate.

Example 13 may optionally include the subject matter of any one of examples 11-12, further comprising a thermal interface material (TIM) in thermal communication with the photonic engine.

Example 14 may optionally include the subject matter of any one of examples 11-13, further comprising a heat spreader in thermal communication with the thermal interface material.

Example 15 may optionally include the subject matter of any one of examples 11-14, further comprising a ball grid array positioned proximate a surface of the substrate.

Example 16 is a method to form a microelectronic package structure, comprising forming a first plurality of bumps having a first height and a second plurality of bumps having a second height on an integrated circuit body of a photonic engine; mounting a transmit die and a receive die to the first plurality of bumps; coupling one or more solder balls to the second plurality of bumps having a second height, greater than the first height; mounting the photonic engine on a substrate adjacent at least one waveguide such that optical signals may be exchanged between the at least one waveguide and the transmit die and the at least one waveguide and the receive die; and mounting a first instrument integrated circuit to the substrate.

Example 17 may optionally include the subject matter of example 16, further comprising applying a fill layer in a region surrounding the first plurality of bumps.

Example 18 may optionally include the subject matter of any one of examples 16-17, wherein an air gap is formed in an area proximate the transmit die and the receive die.

Example 19 may optionally include the subject matter of any one of examples 16-18, further comprising applying a thermal interface material (TIM) to the photonic engine.

Example 20 may optionally include the subject matter of any one of examples 16-19, further comprising positioning a heat spreader in thermal communication with the thermal interface material.

Example 21 may optionally include the subject matter of any one of examples 16-20, further comprising positioning a ball grid array positioned proximate a surface of the substrate.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A microelectronic package structure, comprising:
    a substrate comprising at least one waveguide comprising at least one surface which is disposed in a first plane;
    a first integrated circuit coupled to the substrate;
    a photonic engine coupled to the substrate and comprising:
        an integrated circuit body;
        a transmit die coupled to the integrated circuit body by a plurality of bumps having a first height; and
        a receive die coupled to the integrated circuit body by a plurality of bumps having the first height;
    an optical coupling coupled to the at least one waveguide;
    wherein the integrated circuit body is coupled to the substrate by a second plurality of bumps having a second height, greater than the first height, and
    wherein the photonic engine comprises at least one surface which is positioned in a plane parallel to the first plane and adjacent the at least one waveguide such that optical signals may be exchanged between the at least one waveguide and the transmit die and the at least one waveguide and the receive die.

2. The microelectronic package structure of claim 1, wherein:
    the photonic engine is coupled to the substrate via one or more solder balls; and
    the one or more solder balls are at least partially covered by a mold material,
    wherein the mold material defines an air gap between the transmit die and the at least one waveguide and the receive die and the at least one waveguide.

3. The microelectronic package structure of claim 2, further comprising:
    an optical coupling coupled to the at least one waveguide.

4. The microelectronic package structure of claim 2, further comprising:
   a thermal interface material (TIM) in thermal communication with the photonic engine.

5. The microelectronic package structure of claim 4, further comprising:
   a heat spreader in thermal communication with the thermal interface material.

6. The microelectronic package structure of claim 4, further comprising:
   a ball grid array positioned proximate a surface of the substrate.

7. The microelectronic package structure of claim 1, further comprising:
   a memory device coupled to the substrate.

8. The microelectronic package structure of claim 7, further comprising:
   a thermal interface material (TIM) in thermal communication with the memory device.

9. The microelectronic package structure of claim 8, further comprising:
   a heat spreader in thermal communication with the thermal interface material.

\* \* \* \* \*